US009698717B2

(12) United States Patent
Yamaguchi et al.

(10) Patent No.: US 9,698,717 B2
(45) Date of Patent: Jul. 4, 2017

(54) MOTOR DRIVE DEVICE PROVIDED WITH FUNCTION OF CHANGING CURRENT DETECTION MODE

(71) Applicant: FANUC CORPORATION, Yamanashi (JP)

(72) Inventors: Ryouta Yamaguchi, Yamanashi (JP); Taku Sasaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/006,373

(22) Filed: Jan. 26, 2016

(65) Prior Publication Data

US 2016/0226415 A1    Aug. 4, 2016

(30) Foreign Application Priority Data

Jan. 29, 2015  (JP) .................................. 2015-015952

(51) Int. Cl.
*H02P 21/22*    (2016.01)
*H02P 27/06*    (2006.01)
*G01R 19/00*    (2006.01)
*G01R 19/12*    (2006.01)
*H02P 27/08*    (2006.01)

(52) U.S. Cl.
CPC .......... *H02P 21/22* (2016.02); *G01R 19/0092* (2013.01); *G01R 19/12* (2013.01); *H02P 27/08* (2013.01)

(58) Field of Classification Search
USPC ................................ 318/432, 433, 456, 458
See application file for complete search history.

(56) References Cited

U.S. PATENT DOCUMENTS 5,864,474 A * 1/1999 Jang .......................... H02J 3/32
                                                              187/296
7,084,601 B2 * 8/2006 Maeda .................... G01R 1/203
                                                              318/803
2012/0086383 A1 * 4/2012 Hernandez
                                         Ferrusca ................. H02P 23/08
                                                              318/759

FOREIGN PATENT DOCUMENTS

JP    2003291839 A    10/2003
JP    2008118750 A     5/2008
(Continued)

OTHER PUBLICATIONS

Untranslated Decision to Grant a Patent mailed by Japan Patent Office (JPO) for Application No. JP 2015-015952, Nov. 1, 2016, 3 pages.

(Continued)

*Primary Examiner* — Bentsu Ro
(74) *Attorney, Agent, or Firm* — Fredrikson & Byron, P.A.

(57) ABSTRACT

A motor drive device driving any of a feed shaft or spindle of a machine tool or arm of an industrial machine or industrial robot etc., comprising a current detecting part detecting a motor current, a current control part using an output from the current detecting part as the basis to output a command value to the motor, and a power converting part using a current command as the basis to supply power to the motor, the current detecting part comprising a current slope detecting part and a switching part using an output of the current slope detecting part to switch a plurality of filter characteristics to switch a mode of current detection. The switching part switches to a filter with a narrow/a broad bandwidth when the slope of the current is small/large to thereby improve the precision of current detection.

10 Claims, 6 Drawing Sheets

(56) References Cited

FOREIGN PATENT DOCUMENTS

JP          2013198229 A     9/2013
JP          2013223350 A     10/2013

OTHER PUBLICATIONS

English machine translation of Decision to Grant a Patent mailed by JPO for Application No. JP 2015-015952, Nov. 1, 2016, 3 pages.
Untranslated Notification of Reasons for Refusal mailed by Japan Patent Office (JPO) for Application No. JP 2015-015952, May 31, 2016, 3 pages.
English machine translation of Notification of Reasons for Refusal mailed by Japan Patent Office (JPO) for Application No. JP 2015-015952, May 31, 2016, 3 pages.
English Abstract and Machine Translation for Japanese Publication No. 2013-223350 A, published Oct. 28, 2013, 18 pgs.
English Abstract for Japanese Publication No. 2013-198229 A, published Sep. 30, 2013, 1 pg.
English Abstract for Japanese Publication No. 2008-118750 A, published May 22, 2008, 1 pg.
English Abstract and Machine Translation for Japanese Publication No. 2003-291839 A, published Oct. 15, 2003, 9 pgs.

\* cited by examiner

— ACTUAL CURRENT ACTUALLY FLOWING THROUGH MAIN CIRCUIT
--- CURRENT WHICH AMPLIFIER SWITCHES

MOTOR INDUCTANCE: LARGE
CURRENT RIPPLE: SMALL
AMOUNT OF DISCREPANCY: SMALL

MOTOR INDUCTANCE: SMALL
CURRENT RIPPLE: LARGE
AMOUNT OF DISCREPANCY: LARGE

CURRENT SAMPLING PERIOD REQUIRED FOR CURRENT CONTROL
(EXAMPLE: 10 μ sec)

CURRENT SAMPLING PERIOD REQUIRED FOR DETECTING SLOPE OF CURRENT
(EXAMPLE: 1 μ sec)

MOTOR DRIVE DEVICE PROVIDED WITH FUNCTION OF CHANGING CURRENT DETECTION MODE

BACKGROUND OF THE INVENTION

Field of the Invention

The present invention relates to a motor drive device for driving a feed shaft or spindle of a machine tool or an arm of an industrial machine or an industrial robot etc. wherein the motor drive device is provided with the function of changing a mode of current detection of current flowing through the motor.

Description of the Related Art

In a general motor drive device of a motor used in a machine tool, industrial machine, or industrial robot, the current flowing through the motor is detected by a current detecting part and information on the current is informed to a current control part controlling the current. The current detecting part of a motor drive device is comprised of a current detection device on a main circuit and an A/D converter converting an analog signal detected by the current detection device to a digital signal. The current control part converts the information on the current detected by the current detecting part (analog signal) from an analog to digital format by the A/D converter and uses the converted digital signal to control the current flowing through the motor.

At this time, it is possible to improve the precision of detection of the current flowing through the motor and reduce the error between the actual current and the detected current so as to control the current more accurately. Inside the current detecting part, in the same way as a general electrical circuit, a filter is provided for the purpose of reducing noise riding on a signal line. As such a filter, a motor control device using a decimation filter is disclosed in Japanese Patent Publication No. 2013-198229A.

However, when using a filter designed to reduce noise riding on a signal line inside a current detecting part, in the process of converting a signal from an analog to digital format through the filter after detecting the current flowing through the motor at the current detection device, a time delay occurs between the current information from the current detecting part when reaching the current control part and the actual current. Further, when a small inductance motor is connected to the motor drive device and the slope of increase or decrease of the current becomes greater, the delay causes a discrepancy between the actual current and detected current and the precision of current detection is sometimes lowered.

SUMMARY OF INVENTION

The present invention has as its object the provision of a motor drive device which can suitably change the filter used at the time of current detection in accordance with the state of the current flowing through the motor to thereby improve the precision of current detection.

According to one aspect of the present invention, there is provided a motor drive device driving any of a feed shaft or spindle of a machine tool or arm of an industrial machine or industrial robot etc., comprising a current detecting part detecting a current flowing through a motor, a current control part using an output from the current detecting part as the basis to output a command for running a desired current to the motor, and a power converting part using a command from the current control part as the basis to supply power to the motor, the current detecting part comprising a current slope detecting part detecting a slope of an increase or decrease of current at a certain point of time and a switching part using an output of the current slope detecting part as the basis to switch a mode of current detection.

DETAILED DESCRIPTION

Below, the attached drawings will be used to explain embodiments of the present invention in detail based on specific embodiments.

Figure 1:
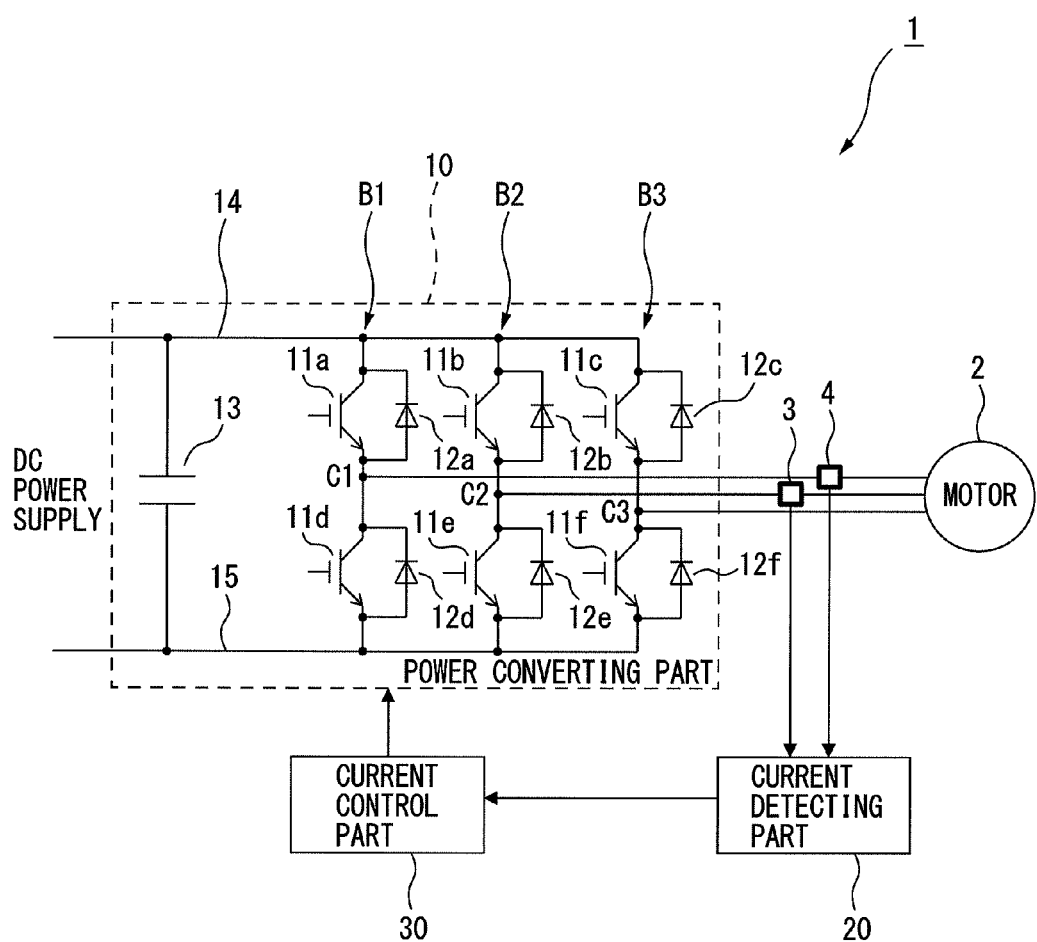
FIG. 1 is a circuit diagram illustrating an overall configuration of a motor drive device to which the present invention is applied.

FIG. 1 illustrates the overall configuration of a motor drive device 1 to which the present invention is applied. The motor drive device 1 is for driving a motor 2 provided at not illustrated machine tool, industrial machine, robot, etc. The motor drive device 1 is provided with a power converting part 10, current detecting part 20, and current control part 30. The motor drive device 1 converts the DC power supplied to the power converting part 10 from a not illustrated DC power supply, or a DC power supply converting a three-phase AC power supply to direct current, to three-phase AC power by the power converting part 10 and supplies the three-phase AC current to the motor 2 to drive the motor 2.

The power converting part 10 is provided with six switching devices 11a to 11f and six diodes 12a to 12f and a DC capacitor 13. The switching devices 11a to 11f are IGBT (insulated gate bipolar transistors) or MOSFET (metal oxide semiconductor field effect transistors) or other switching devices which are turned on/off by switching signals. At the power converting part 10, three bridge circuits B1, B2, and B3, each comprised of two switching devices connected in series between a positive voltage line 14 and a negative voltage line 15, are connected in parallel. To these switching devices 11a to 11f, protection use diodes 12a to 12f are respectively connected in parallel.

Further, connecting points C1, C2, and C3 of the switching devices 11a to 11f in the three bridge circuits B1, B2, and B3 are respectively connected to a U-phase, V-phase, and W-phase of the three-phase AC motor 2. Further, the DC capacitor 13 stores a DC charge.

At two of the circuits among the three circuits supplying AC power from the power converting part 10 to the motor 2, current detection devices 3, 4 are provided. These detect the U-phase current, V-phase current, and W-phase current to the motor 2. With a three-phase alternating current, if the currents of two phases among the U-phase current, V-phase current, and W-phase current are known, the current of the remaining phase is known, so among the three circuits, the circuit through which the U-phase current flows and the circuit through which the V-phase current flows are provided with the current detection devices 3, 4. The currents of the different phases detected by the current detection devices 3, 4 (analog signals) are input into the current detecting part 20 where they are converted to a digital signal. The current detecting part 20 feeds back the digital signal obtained by the conversion operation to the current control part 30.

The current control part 30 uses the digital signal fed back from the current detecting part 20 as the basis to control the switching devices 11a to 11f of the power converting part 10 and control the current flowing through the motor 2. That is, at the power converting part 10, switching signals from the current control part 30 are used to convert direct current to alternating current of the desired frequency by the three-phase bridge circuits B1, B2, and B3 (inverter circuits) comprised of the six switching devices 11a to 11f and diodes 12a to 12f so as to drive the motor 2. At this time, the current control part 30 uses PWM control (pulse width modulation control) to control the three-phase bridge circuits B1, B2, and B3. The configuration and operation of such a motor drive device 1 are known, so further explanation will be omitted.

Figure 2:
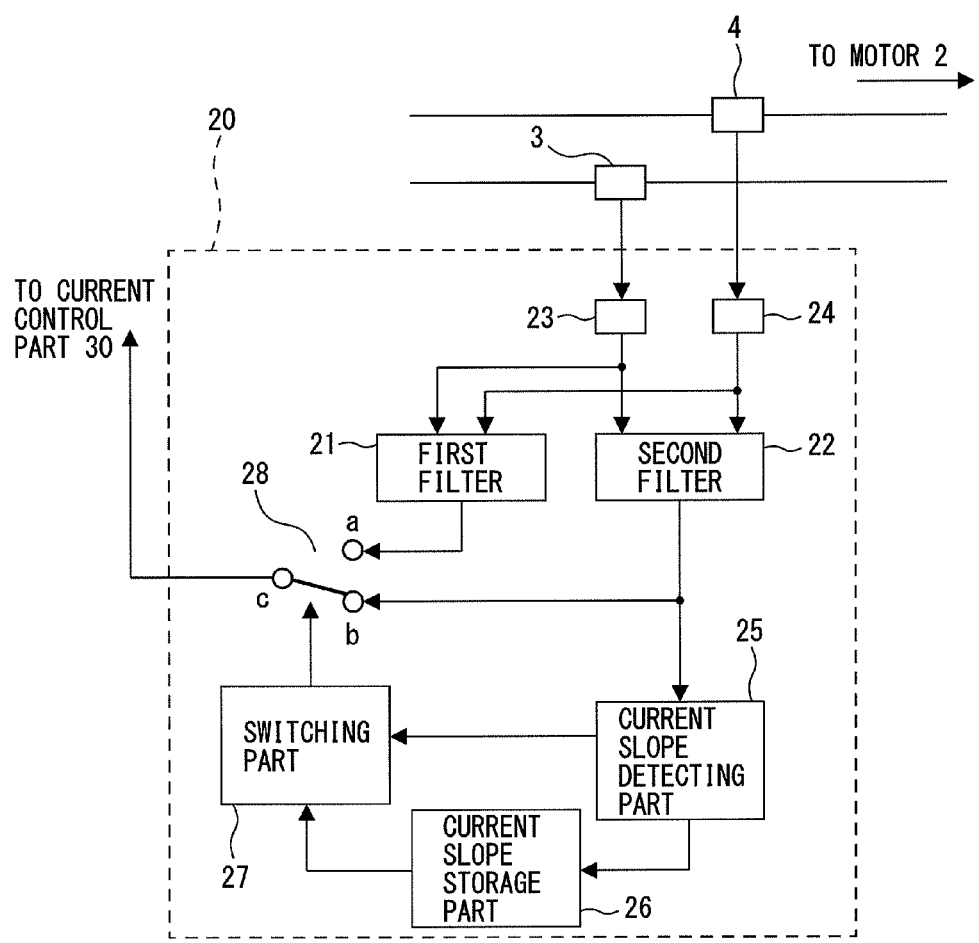
FIG. 2 is a circuit diagram illustrating a circuit configuration of a first embodiment of the present invention at a current detecting part of the motor drive device illustrated in FIG. 1.

FIG. 2 illustrates the circuit configuration of a first embodiment of the present invention at the current detecting part 20 of the motor drive device 1 illustrated in FIG. 1. The current detecting part 20 includes a first filter 21, second filter 22, A/D converters 23, 24, current slope detecting part 25, current slope storage part 26, switching part 27, and changeover switch 28. The first filter 21 and the second filter 22 are noise removal filters for current flowing through the circuit. Compared with the second filter 22, the first filter 21 is a filter having better sensitivity (smaller time constant and broader bandwidth). The second filter is a filter having a large time constant and narrow bandwidth. For example, if the time constant of the second filter 22 is made 3 μsec, for the first filter 21, a filter with a time constant of 1 μsec is used. In the first embodiment, the output of the current detection device 3 is converted by the A/D converter 23 from an analog to digital format and is input to the first filter 21 and second filter 22, while similarly the output of the current detection device 4 is converted by the A/D converter 24 from an analog to digital format and is input to the first filter 21 and second filter 22. Accordingly, the first and second filters 21, 22 are digital filters. On the other hand, if there are no A/D converters 23, 24 between the current detection devices 3, 4 and the first and second filters 21, 22, the first and second filters 21, 22 are analog filters.

The A/D converters 23, 24 convert the analog signals detected by the current detection devices 3, 4 to digital signals. The digital signals illustrating the current values converted at the A/D converters 23, 24 are respectively input to both the first filter 21 and the second filter 22. The output terminal of the first filter 21 is connected to a contact "a" of the changeover switch 28. The output terminal of the second filter 22 is connected to a contact "b" of the changeover switch 28 and is connected to the current slope detecting part 25 as well. For this reason, the signal from which noise has been reduced by the second filter 22 is input to the current slope detecting part 25. A contact "c" of the changeover switch 28 is connected to the current control part 30.

The current slope detecting part 25 detects the slope of the current from the digital signal illustrating the input current value and stores the detected value in the current slope storage part 26 and inputs it to the switching part 27. The slope of the current will be explained later. The switching part 27 receives as input the signal from the current slope detecting part 25 and the signal from the current slope storage part 26. The switching part 27 connects the changeover switch 28 to either of the first filter 11 or the second filter 22 depending on the slope of the current from the current slope detecting part 25 or the slope of the current from the current slope storage part 26.

The slope of a current at the present time can be measured by the current slope detecting part 25. When the insulation of a cable has deteriorated, when foreign matter has deposited, or when there is otherwise an abnormality at a part relating to the slope of current and the slope of the current at the present time cannot be correctly detected, the slope which was stored at the time of the normal state in the current slope storage part 26 can be used. Due to this, even in a situation where measurement of the current at the present time is difficult, the slope which as stored at the current slope storage part 26 can be used to select the optimum filter. As a result, the current control part 30 receives as input the normal signal of either a signal passed through the first filter 21 and a signal passed through the second filter 22.

Figure 3:
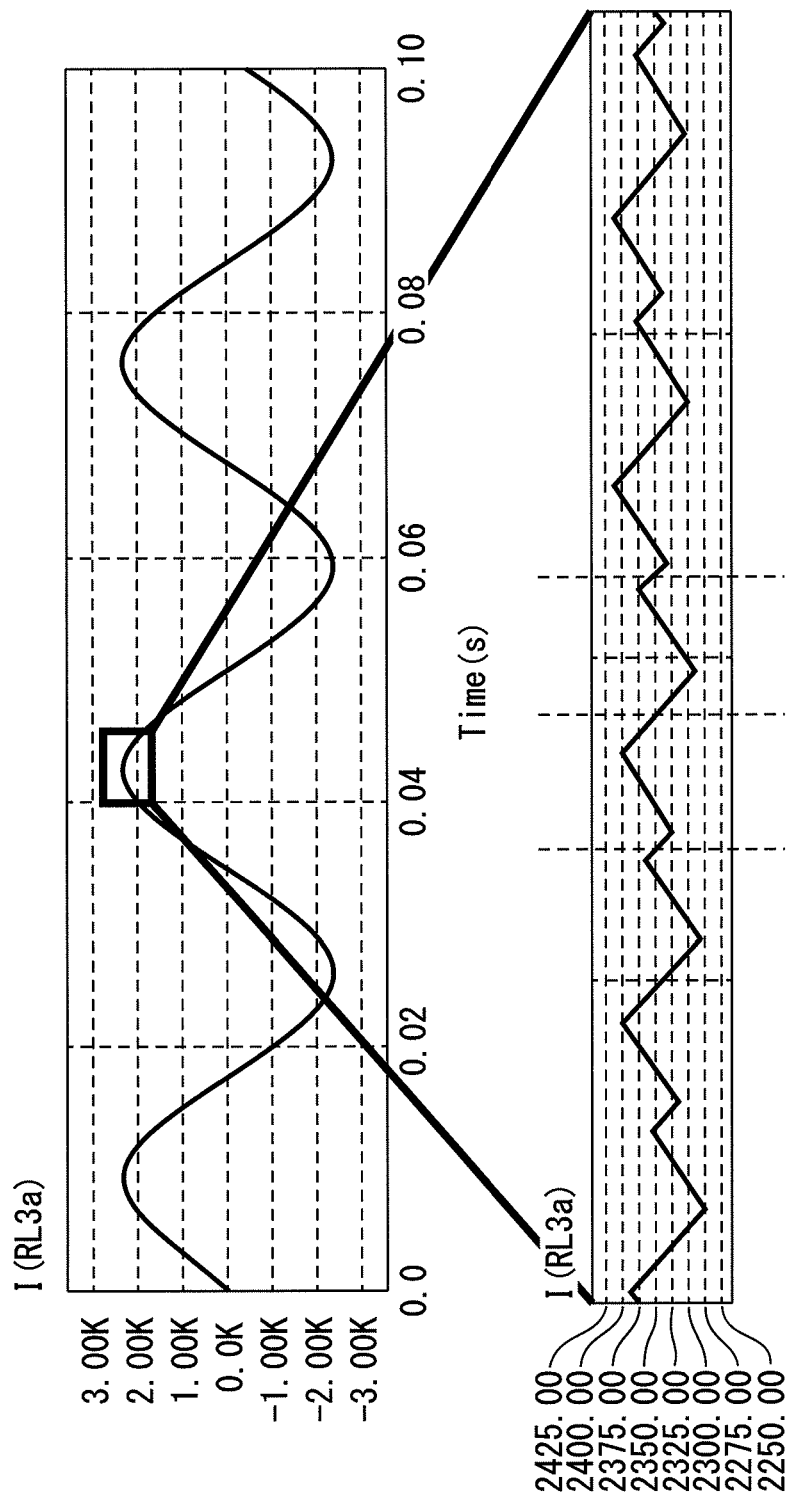
FIG. 3 is a waveform diagram enlarging part of the waveform of a current of a sine wave produced by PWM control and illustrating a ripple component.

Here, the ripple component included in the motor drive current when, in the motor drive device 1 illustrated in FIG. 1, the current control part 30 performs PWM control will be explained using FIG. 3. When the current control part 30 controls the power converting part 10 by PWM control, the motor drive current which is produced by PWM control is a sine wave such as illustrated in FIG. 3, but if enlarging part of this, the current rises and falls with a ripple component corresponding to the timing of the PWM control. The rise and fall of the current with a ripple component, by being repeated, appears to draw a sine wave if viewed over a long time range. The "slope of the current" is the slope of this ripple component and the slope at the increase or decrease of current at a certain point of time. Below, this will be simply referred to as the "slope of the current".

The ripple component of the current generated due to switching by PWM control is determined in slope by the inductance of the main circuit including the motor. In particular, when driving a low inductance motor, the slope of the ripple component of the current becomes larger compared with the time of driving a high inductance motor. In a general motor drive device, to avoid the effects of noise due to switching, the current is often sampled between one switching operation and another switching operation, that is, at the intermediate time in a section during which the current falls to the right (or rises to the right).

Figure 4A:
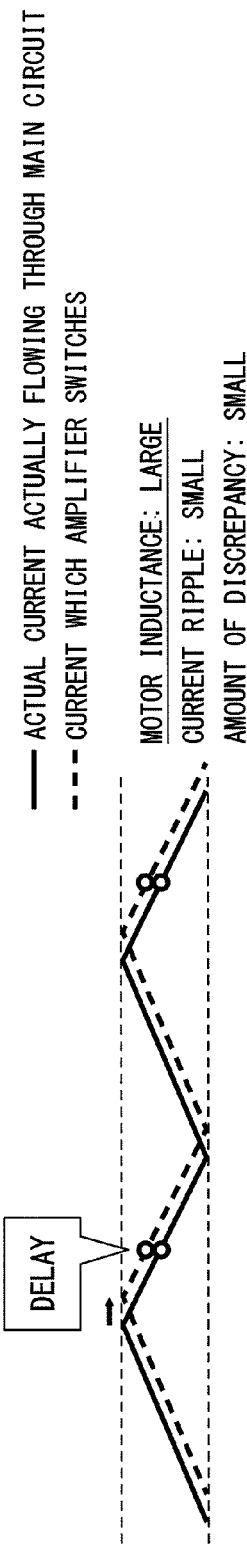
FIG. 4A is a waveform diagram explaining a discrepancy between an actual current and a detected current due to current ripple when a motor inductance is large.
Figure 4B:
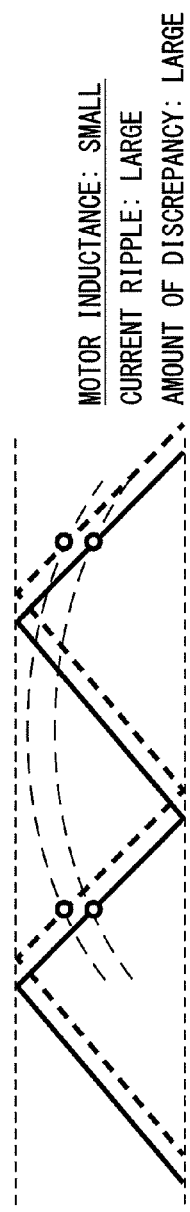
FIG. 4B is a waveform diagram explaining a discrepancy between an actual current and a detected current due to current ripple when a motor inductance is small.

On the other hand, the current which the current detecting part 20 detects in the motor drive device 1 illustrated in FIG. 1 is always delayed from the actual current due to passing through the noise removal filter at the current detecting part 20. As one example, the case of sampling in the section where the current is falling to the right will be explained. FIG. 4A and FIG. 4B are waveform diagrams explaining the discrepancy between the actual current and the detected current due to current ripple. As illustrated by the waveform diagram of FIG. 4A, when driving a high inductance motor, the actual current illustrated by the solid line falls. During this, the detected current detected by the current detecting part 20 and illustrated by the broken line draws the same current waveform but delayed from the actual current. For this reason, when sampling by the same timing in the section where the current is falling to the right, the detected current becomes a higher current value than the actual current at the same point of time.

Further, as illustrated by the waveform diagram of FIG. 4B, when driving a low inductance motor, the slope of the ripple component of the current becomes larger compared with when driving a high inductance motor. This being so, the error of the detected current, detected by the current detecting part 20 and illustrated by the broken line, from the actual current, that is, the slope of the ripple component of the current illustrated in the waveform diagram of FIG. 4A, becomes larger compared with when driving a high inductance motor. In this way, the magnitude of the slope of the ripple component of the current and the error of the detected current from the actual current have correspondence. When using the same timing for sampling, the larger slope of the ripple component of the current, the greater the error of the detected current from the actual current.

Note that, here, as one example, the case of sampling in the section falling to the right was explained, but in the case of a system performing sampling at the same timing in the section rising to the right, as will be clear from FIG. 4A and FIG. 4B, the delay of the detected current illustrated by the broken line from the actual current illustrated by the solid line causes the detected current to be detected lower than the actual current.

Therefore, in the present invention, in the current judging part 20 illustrated in FIG. 2, the slope of the detected current is detected by the current slope detecting part 25 from the signal passing through the second filter 22. The slope of the current detected by the current slope detecting part 25 is input to the control part 27 and is stored in the current slope storage part 26. Further, the switching part 27 receives the slope of the current at the present time from the current slope detecting part 25 and information on the slope of the previous current from the current slope storage part 26 and judges if the second filter 22 is suitable. When the switching part 27 judges that the present second filter 22 is not suitable, the mode of current detection (filter) is switched by selecting the filter with a better sensitivity (smaller time constant) (in the present embodiment, the first filter 21) from the plurality of filters (in the present embodiment, the first filter 21 and the second filter 22) and the contact "c" of the changeover switch 28 is switched from the contact "b" connected to the second filter 22 to the contact "a" connected to the first filter 21.

Figure 5A:
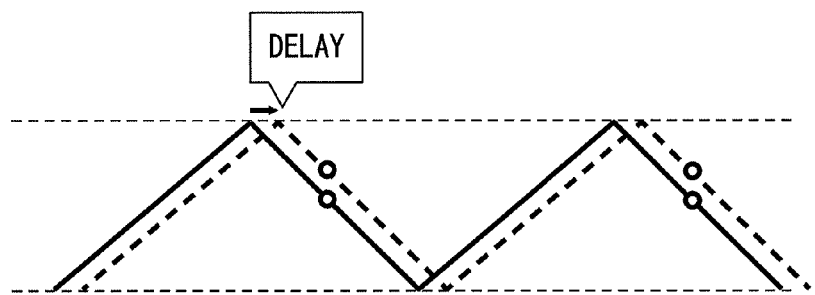
FIG. 5A is a waveform diagram explaining a discrepancy between an actual current and a detected current due to current ripple before switching filters.
Figure 5B:
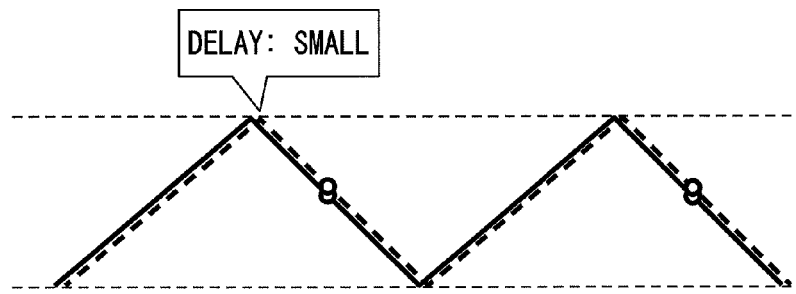
FIG. 5B is a waveform diagram illustrating filter switching causing the discrepancy due to current ripple to be resolved.

The waveform illustrated in FIG. 5A is the waveform of the ripple component of the current when the contact "c" of the changeover switch 28 is connected to the contact "b" connected to the second filter 22. The solid line illustrates the actual current waveform, while the broken line illustrates the detected current. Further, the waveform illustrated in FIG. 5B is the waveform of the ripple component of the current when the connection of the contact "c" of the changeover switch 28 is switched to the contact "a" connected to the first filter 21. The solid line illustrates the actual current waveform, while the broken line illustrates the detected current.

By using the switching part 27 to switch the mode of current detection from the second filter 22 to the better sensitivity first filter 21, the discrepancy due to current ripple is eliminated as illustrated in the waveform illustrated in FIG. 5B.

Figure 6:
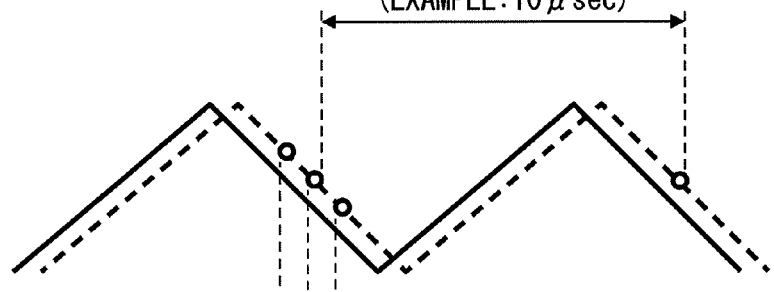
FIG. 6 is a waveform diagram illustrating a sampling period of current required for detecting a slope at an increase and decrease of current.

Here, the detection of the slope of current by the current slope detecting part 25 will be explained using FIG. 6. In general, in a motor drive device, the sampling period when detecting the magnitude of current used for current control is, as illustrated in FIG. 6, for example, 10 μsec. On the other hand, to detect the slope of current in the present invention, due to the high frequency of the ripple current, a sampling period of 10 μsec is insufficient.

Therefore, in the present invention, as illustrated in FIG. 6, for example, the ripple current is sampled by a high speed period of a 1 μsec period. That is, if sampling at least twice in the middle of the fall to the right of the ripple current (downward slope) illustrated in FIG. 6, it is possible to find the slope of the current, so the ripple current is sampled at a high speed matched with the frequency of the ripple current, for example, a 1 μsec period.

Such high speed sampling may be performed just at the instant of detecting the slope of the current or may be performed at all times. However, in general, shortening the sampling period of A/D conversion is accompanied with an increase in the power consumption, so except at the instant of detecting the slope of current, the sampling is preferably performed by the normal period for current control (for example, 10 μsec). However, if there is no concern over an increase in power consumption, it is possible to perform the high speed sampling at all times to detect the current values, remove the unnecessary current values from the large number of detected current values, and make just the required current values the current values for current control use.

Further, the switching between the first filter 21 and the second filter 22 in the switching part 27 switching the current detection modes can, for example, be performed in the following way.

Switching Example 1

First (at the time of turning on the power or at the time of the initialization), for example, the second filter 22 of the time constant 3 μsec is selected. In this case, most cases can be covered except for some small inductance motors. Further, if the output of the current slope detecting part 25 enables it to be judged that the second filter 22 is enough, the second filter 22 is not switched. On the other hand, if the output of the current slope detecting part 25 enables it to be judged that with the second filter 22, the time constant is too large, the filter connected to the current control part 30 is switched to the first filter 21 with the time constant 1 μsec. In the case of such a method, except for some cases, in the majority of cases, there is the merit that no operation for switching the second filter 22 to the first filter 21 is required.

Next, the case where the switching part 27 switching the current detection mode can switch among three filters will be explained. In this case, for the current detecting part 20 of the motor drive device 1 illustrated in FIG. 1, the circuit of the second embodiment illustrated in FIG. 7 will be used. The structures of the first filter 21, second filter 22, A/D converters 23, 24, current slope detecting part 25, current slope storage part 26, and switching part 27 of the current detecting part 20 of the second embodiment are the same as in the first embodiment. Therefore, the time constant of the first filter 21 is 1 μsec, while the time constant of the second filter 22 is 3 μsec.

The third filter 43 is made a filter having a time constant intermediate between the time constant of the first filter 21 and the time constant of the second filter 22. For example, it is made a filter having a 2 μsec time constant. Further, the changeover switch 29 is provided with three contacts at the input side, that is, the contact "a", contact "b", and contact "d". Each of these contacts are connected to the output side contact "c". The output terminal of the first filter 21 is connected to the contact "a", while the output terminal of the second filter 22 is connected to the contact "b" in the same way as the first embodiment. The input signal to the third filter 43 is the same as the first filter 21 and the second filter 22. The output terminal of the third filter 43 is connected to the contact "d" of the changeover switch 29. In the current detecting part 20 of the second embodiment, the first filter 21, second filter 22, and third filter 43 at the switching part 27 switching the current detection mode can be switched as follows for example.

Switching Example 2

First, for example, at the time of turning on the power or at the time of the initialization, among the options, the first filter 21 with the smallest time constant (time constant of 1 μsec) is selected. The reason is because to accurately detect the slope of current, a smaller time constant filter is advantageous. Further, due to the output from the current slope detecting part 25, when the slope of the current is small, the switching part 27 selects the second filter 22 with the largest time constant. When the slope of current becomes slightly larger, the third filter 43 with the second largest time constant is selected, while when the slope of current becomes even larger, the first filter 21 with the smallest time constant is selected. In the case of this method, there is the merit that the slope of the current can be found more accurately.

Note that, in the test state etc., it is possible to switch a specific phase to detect and store the state of current and enable use of the state set at the time of the test at the time of drive as well. Further, the number of filters provided at the current detecting part 20 is not limited to two or three. The effect of the delay of a signal passing through the filter when the slope of the current is large on the precision of current detection is often greater than the effect of noise predicted to increase when making the time constant of the filter smaller. For this reason, change of the time constant of the filter corresponding to the slope of the current like in the present invention results in improvement of the precision of detection of current. That is, setting the optimum filter to make the delay in current smaller and thereby suppressing delay of detection according to the present invention is more effective in improving the precision of current detection than even improvement of the S/N ratio by the ability to reduce noise when using a filter with a large time constant.

Further, as the system for A/D conversion of the current detection, in recent years, ΔΣ modulation type A/D conversion has been becoming the mainstream, but when employing ΔΣ modulation type A/D conversion, the "switching of the filter" by the switching part 27 can also be performed by a ΔΣ modulation type A/D conversion digital filter part. By changing the order or decimation of the digital filter part in accordance with the slope of the current, it is possible to change the delay of the filter. In the case of this method, an LSI or other logic circuit in an IC can be used, so for example there is the merit that switches and other parts for switching the filter circuit become unnecessary.

Figure 7:
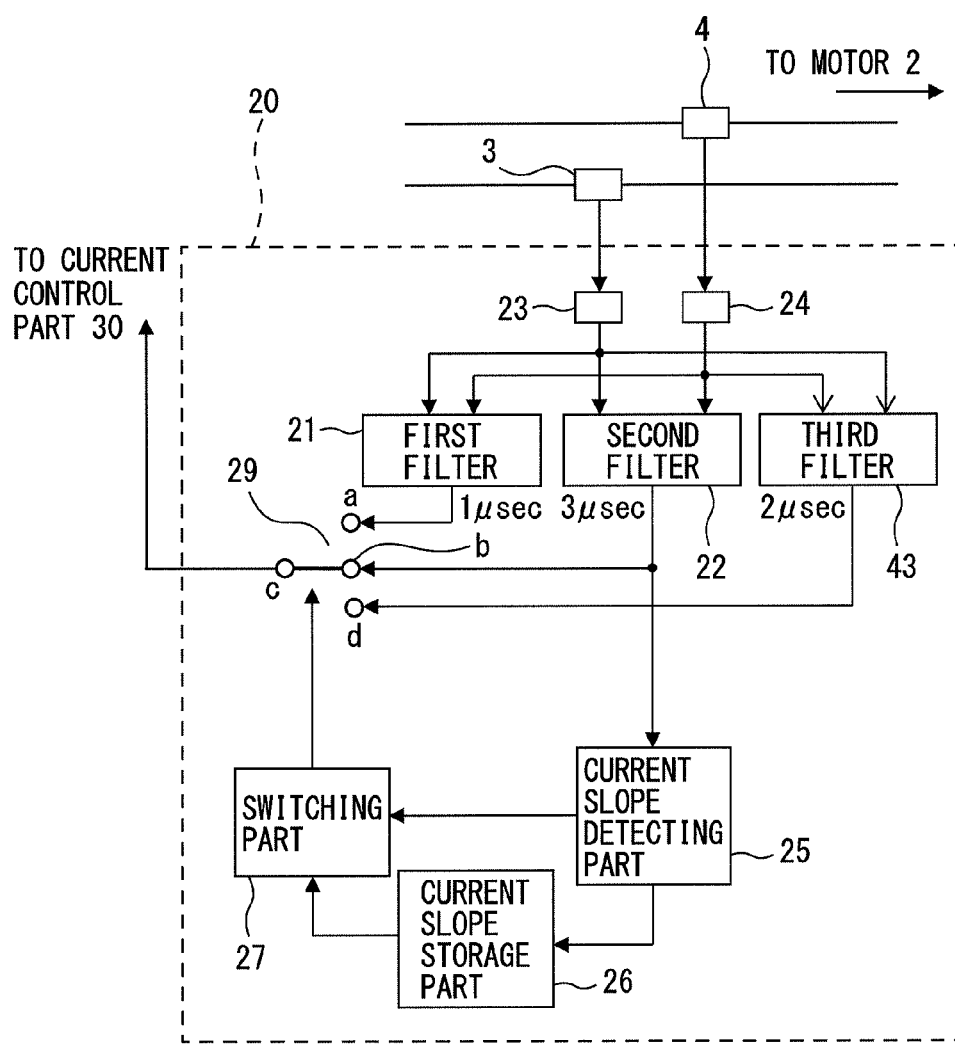
FIG. 7 is a circuit diagram illustrating a circuit configuration of a second embodiment of the present invention at a current detecting part of the motor drive device illustrated in FIG. 1.

On the other hand, in the configurations of FIG. 2 and FIG. 7, if there are no A/D converters 23, 24 at the output circuits of the current detection devices 3, 4, the first and second filters 21, 22 or the third filter 43 can be made analog filters. In this case, after the first and second filters 21, 22, for example, the current slope detecting part 25 can be provided with an A/D converter.

In the above explained embodiment, the slope of the current to the motor 2 at a certain instant is detected in the state where the motor 2 illustrated in FIG. 1 is operating, that is, in the state where the switching devices 11a to 11f are being turned on/off in various combinations. However, at what sort of timing of the on/off operations of the switching devices 11a to 11f the current should be sampled to enable the accurate slope of the current to be detected is difficult to judge. Therefore, it is possible to provide a special operating pattern of the switching devices 11a to 11f enabling current easy to sample for detecting the slope of current to be run to the power converting part 10 separate from such normal motor drive operation.

By using this special operating pattern to drive the switching devices 11a to 11f and run current through the power converting part 10, the timings of sampling of current at the on/off operations of the switching devices 11a to 11f become clear and the accurate slope of the current can be detected. The slope of the current detected by using the special operating pattern to drive the switching devices 11a to 11f to run current through the power converting part 10 is stored in the current slope storage part 26.

The switching devices 11a to 11f are operated by the special operating pattern not during a normal motor drive operation, but, for example, at the time of startup or the time of a test etc. Therefore, in this case, regardless of the on/off state of the motor 2, the slope of the current flowing through the motor 2 can be detected in the state with no current run through the motor 2. Further, the slope of the current is determined by the inductance of the circuit through which the current flows, so there is no change in the slope of the current both during normal operation of the switching devices 11a to 11f and during operation by the special operating pattern. The special operating pattern can, for example, be stored in advance in the current control part 30.

One example of the method of detecting the slope of current flowing through the motor 2 in the state where no current is run to the motor 2 will be explained using FIG. 1 and FIG. 2. With this method, first, all of the switching devices 11a to 11f illustrated in FIG. 1 are turned off in state (state where no current is run to motor 2). Next, from this state, if for example turning on just the switching devices 11a and 11e for a certain time (as one example, 10 μsec), a current flows by a route passing through the current detection devices 3 and 4 by a slope corresponding to the inductance of the motor 2. Therefore, if detecting the slope of the current at this time by the current slope detecting part 25 illustrated in FIG. 2, the timing of detection of slope of the current becomes clear and the slope of the current can be detected more accurately.

Note that, in the above method, a pattern of turning the switching devices 11a and 11e on was explained, but the pattern of turning on the switching devices may be other patterns as well. Further, it is also possible to judge the slope of current overall from the results of operation by a plurality of patterns.

As explained above, in the present invention, if the slope of the current is larger at the motor drive device, it is possible to use a filter with a small time constant to detect current by a suitable mode corresponding to the state of the current flowing through the motor. As a result, it becomes possible to improve the precision of current detection and reduce the error in current detection and thereby control current more accurately.

Note that, if making the time constant of the filter smaller, the ability to reduce noise becomes smaller compared with the case of using a filter with a large time constant. However, if the slope of the current is large, the effect due to the discrepancy between the sampled current and actual current occurring due to the delay due to the use of a filter with a large time constant is further greater, so the precision of current detection is improved as a result. Further, in the embodiments explained above, the example of application of the present invention to a part of the motor drive device using an inverter was explained, but the present invention can also be applied to a converter in the motor drive device.

In the above way, according to the motor drive device of the present invention, it is possible to change the filter at the time of current detection to a suitable one corresponding to the state of the current flowing through the motor, so there is the effect that it is possible to improve the precision of current detection.

Above, the present invention was explained with reference to preferred embodiments, but a person skilled in the art would understand that various modifications and changes could be made without departing from the scope of disclosure of the later explained claims.

What is claimed is:

1. A motor drive device driving any of a feed shaft or spindle of a machine tool or arm of an industrial machine or industrial robot etc., comprising
   a current detecting part detecting a current flowing through a motor,
   a current control part using an output from said current detecting part as the basis to output a command for running a desired current to said motor, and
   a power converting part using a command from said current control part as the basis to supply power to said motor,
   said current detecting part comprising
   a current slope detecting part detecting a slope of an increase or decrease of current at a certain point of time and
   a switching part using an output of said current slope detecting part as the basis to switch a mode of current detection,
   wherein said switching part switches among a plurality of two or more filters differing in filter characteristics to thereby switch the mode of current detection, and,
   wherein said switching part switches to a narrow bandwidth filter when a slope of current is small and switches to a broad bandwidth filter when a slope of current is large.

2. The motor drive device according to claim 1 wherein the input to said current slope detecting part is the output of said narrow bandwidth filter.

3. The motor drive device according to claim 1 wherein the input of said plurality of filters changes depending on the positions of A/D converters and which part in the current detection circuit is being filtered and is a digital value when filtering a back part of said A/D converters and an analog value when filtering a front part of said A/D converters.

4. The motor drive device according to claim 1 wherein said current slope detecting part samples the current value at a high speed and uses the results as the basis to judge the slope of current.

5. The motor drive device according to claim 4 wherein
   a system of AD conversion of said A/D converters is $\Delta\Sigma$ modulation type A/D conversion,
   said filters are digital filters forming $\Delta\Sigma$ modulation type A/D conversion.

6. The motor drive device according to claim 4 wherein said current slope detecting part constantly samples the current value at a high speed.

7. The motor drive device according to claim 4 wherein said current slope detecting part samples the current value at a high speed only in the instant of detecting the slope of current.

8. The motor drive device according to claim 1 which has, separate from normal motor drive, a special operating pattern enabling it to run a current easy to sample for detecting a slope of current to said power converting part, detect the current, and store the slope in the current slope storage part.

9. The motor drive device according to claim 1 wherein
   said current detecting part further has a current slope storage part storing the slope of the current detected by said current slope detecting part, and
   said switching part also switches the mode of current detection by the slope of the current read from said current slope storage part.

10. The motor drive device according to claim 9 wherein said switching part switches the mode of current detection by the slope of current read out from said current slope storage part when there is an abnormality at a location relating to the slope of the current and when said current slope detecting part cannot accurately detect the slope of the present current.

* * * * *